(12) United States Patent
Mohanta et al.

(10) Patent No.: US 12,356,651 B2
(45) Date of Patent: Jul. 8, 2025

(54) METHOD OF MANUFACTURING HIGH-ELECTRON-MOBILITY TRANSISTOR

(71) Applicant: Taiwan Semiconductor Manufacturing Company, Hsinchu (TW)

(72) Inventors: Pravanshu Mohanta, Hsinchu (TW); Wei-Ting Chang, Miaoli County (TW); Ching Yu Chen, Zhubei (TW); Jiang-He Xie, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 500 days.

(21) Appl. No.: 17/752,970

(22) Filed: May 25, 2022

(65) Prior Publication Data

US 2023/0387282 A1 Nov. 30, 2023

(51) Int. Cl.
*H10D 30/47* (2025.01)
*H01L 21/223* (2006.01)
*H10D 30/01* (2025.01)
*H10D 62/815* (2025.01)
*H10D 62/85* (2025.01)
*H10D 62/854* (2025.01)

(52) U.S. Cl.
CPC ....... *H10D 30/475* (2025.01); *H01L 21/2233* (2013.01); *H10D 30/015* (2025.01); *H10D 62/8161* (2025.01); *H10D 62/8503* (2025.01); *H10D 62/854* (2025.01)

(58) Field of Classification Search
CPC .............. H01L 29/7786; H01L 29/151; H01L 29/2003; H01L 29/207; H01L 29/66462; H01L 21/2233
See application file for complete search history.

(56) References Cited

U.S. PATENT DOCUMENTS

| | | | |
|---|---|---|---|
| 8,575,660 B2 * | 11/2013 | Nelson | H10D 62/8503 257/E29.09 |
| 9,608,075 B1 * | 3/2017 | Wan | H01L 21/02581 |
| 10,431,656 B2 * | 10/2019 | Ishiguro | H10D 30/015 |
| 11,335,799 B2 * | 5/2022 | Jiang | H10D 84/05 |
| 2020/0075314 A1 * | 3/2020 | Chen | H10D 62/8503 |

* cited by examiner

*Primary Examiner* — Mark W Tornow
(74) *Attorney, Agent, or Firm* — Lippes Mathias LLP

(57) ABSTRACT

A method of manufacturing a High-Electron-Mobility Transistor (HEMT) includes: preparing a substrate; forming a first buffer over the substrate; forming a second buffer over the first buffer, wherein forming the second buffer includes doping a first thickness of a material such as gallium nitride (GaN) with a first concentration of a dopant such as carbon, and doping a second thickness of the material with a second concentration of the dopant such that the second concentration of dopant has a gradient though the second thickness which progressively decreases in a direction away from the first thickness; forming a channel layer such as a GaN channel over the second buffer; forming a barrier layer such as aluminum gallium nitride (AlGaN) over the channel layer; and forming drain, source and gate terminals for the HEMT.

20 Claims, 7 Drawing Sheets

METHOD OF MANUFACTURING HIGH-ELECTRON-MOBILITY TRANSISTOR

BACKGROUND

The following relates to the semiconductor arts, and in particular, to semiconductor devices and methods for manufacturing the same. It finds application in connection with a High-Electron-Mobility Transistor (HEMT), for example, such as Gallium Nitride (GaN)-based HEMT, and is described herein with reference thereto. However, it is to be appreciated that it is likewise suitable for use in connection with other like applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
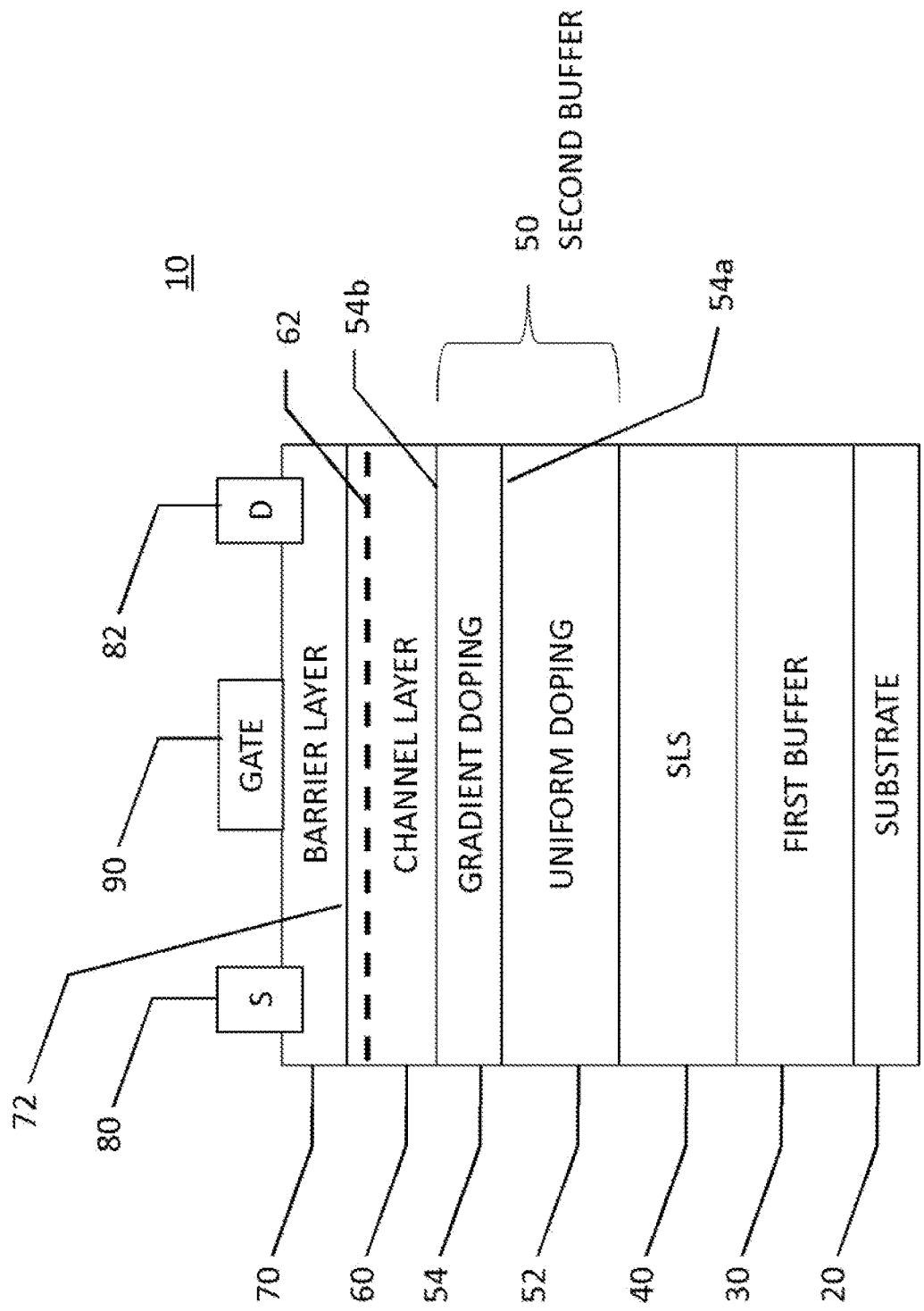
FIG. 1 diagrammatically illustrates a cross-section view of a HEMT in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "under," "above," "upper," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor technology, Group III-Group V (or III-V) semiconductor compounds are used to form various integrated circuit (IC) devices, for example, such as, Field-Effect Transistors (FETs). In general, various embodiments disclosed herein are directed to a semiconductor device, such as a High-Electron-Mobility Transistor (HEMT) device, and a method, process and/or system for manufacturing the same. A HEMT is a field effect transistor incorporating a junction between two materials with different band gaps (i.e., a heterojunction) as the channel instead of a doped region, as is generally the case, for example, for Metal-Oxide Semiconductor Field-Effect Transistors (MOSFETs). In general, HEMTs have a number of advantageous properties, for example, including, without limitation: high electron mobility; relatively high gain, for example, which makes them useful for amplifiers; relatively high switching speeds and/or the ability to transmit signals at high frequencies; significantly low noise values; etc. Group III-nitride semiconductor compounds have a large bandgap compared to other Group III-V materials such as group III-arsenide materials. For example, gallium nitride (GaN) has a room temperature bandgap of around 3.4 eV, compared with a bandgap of around 1.42 eV for gallium arsenide (GaAs). The large bandgap makes group III-nitride-based devices well suited for applications calling for high power and/or operating at high temperature. For example, GaN-based devices find application in electronic devices and systems such as fast chargers, mobile switchers, integrated circuit (IC) drivers, on-board chargers (OBC), power for server/data centers, electric vehicles, and so forth, by way of some nonlimiting illustrative examples.

One type of group III-nitride device used in such tasks is the p-GaN HEMT. In this device, a two-dimensional electron gas (2DEG) is formed at a heterointerface between a ternary aluminum gallium nitride ($Al_xGa_{1-x}N$) layer and a gallium nitride (GaN) layer. The subscript x in $Al_xGa_{1-x}N$ denotes the Al fraction, where x=0 corresponds to GaN and x=1 corresponds to MN. For notational convenience herein, $Al_xGa_{1-x}N$ is sometimes written without the subscripts as AlGaN. The 2DEG is formed due to the piezoelectric effect, and the AlGaN layer is thin enough to be coherently strained, i.e., the in-plane lattice constant of the thin AlGaN layer is strained to match the in-plane lattice constant of the thicker GaN layer. The AlGaN layer is also sometimes referred to herein as a barrier layer, as it operates to provide the in-plane confinement of the 2DEG to the heterointerface between the GaN and the AlGaN.

In GaN-based GaN HEMT devices, carbon doping can be used for achieving high resistive GaN buffer, whose role is to prevent the current collapse as well as suppress dynamic $R_{on}$. A carbon-doped GaN buffer (denoted as c-GaN herein) with intrinsic doping can be formed below the undoped GaN channel layer, denoted as u-GaN. (Undoped in this context indicates not-intentionally-doped, and grown under conditions designed to have low intrinsic doping substantially lower than that of the c-GaN material). In intrinsically carbon doped c-GaN, hydrocarbons act as a carbon source for doping, and the intrinsic carbon doping can be optimized by controlling growth parameters such as temperature, pressure, and growth rate. Parameters to achieve a high carbon doping levels typically include low growth temperature, low pressure, and high growth rate. However, these growth conditions lead to degraded epitaxial quality manifesting as higher dislocation density and surface roughness at the interface on which the u-GaN channel is to be grown. This can lead to degraded GaN-based HEMT performance for multiple reasons. First, the low quality c-GaN buffer can lead to high density of electron traps that are not fully compensated and can degrade the 2DEG confinement for gate control. Second, the carbon can diffuse to the AlGaN barrier layer. Third, the low quality buffer can result in punch through effects, which adversely impact device performance and lead to current collapse.

In embodiments disclosed herein, an upper portion of the c-GaN layer is modified by augmenting the intrinsic carbon doping with extrinsic carbon doping to form a linear or other carbon doping gradient. In some illustrative embodiments, the intrinsic carbon doping controlled by growth temperature, pressure, and growth rate is augmented with extrinsic carbon doping controlled C/Ga ratio using hexene carbon dopant, by way of nonlimiting illustrative example. This counteracts the above-mentioned c-GaN degradation mechanisms as follows. The linear carbon grading suppresses the current collapse effect by compensating the electron traps in the upper portion of the buffer (where the carbon gradient is introduced), so that there is improved 2DEG confinement. Additionally, the grading of the carbon doping in the upper portion of the c-GaN buffer improves the quality of the subsequently grown u-GaN channel, providing substantially reduced dislocation density which also reduces the current collapse effect. Still further, the carbon gradient introduces a band structure that contributes to the in-plane confinement of the 2DEG.

FIG. 1 shows a cross-section view of a HEMT device 10 in accordance with some embodiments disclosed herein. In some suitable embodiments, the HEMT device 10 includes: a substrate 20; a first buffer layer 30 formed over the substrate 20; an optional Strained-Layer Superlattice (SLS) layer 40 formed over the first buffer layer 30; a second buffer layer 50 formed over the SLS layer 40; a channel layer 60 formed over the second buffer layer 50; a barrier layer 70 formed over the channel layer 60; a source structure and/or terminal 80 formed over the barrier layer 70; a drain structure and/or terminal 82 formed over the barrier layer 70; and a gate structure and/or terminal 90 formed over the barrier layer 70 between the source structure and/or terminal 80 and the drain structure and/or terminal 82. In an alternative view, the SLS layer 40 may be considered part of the first buffer layer 30, 40.

In some suitable embodiments, the substrate 20 may be a silicon wafer or otherwise, for example, having a so-called (111) lattice orientation. The substrate 20 may comprise, for example, bulk silicon (Si), doped or undoped, or an active layer of a semiconductor-on-insulator (SOI) substrate. Generally, a SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 20 may include another elementary semiconductor, such as germanium (Ge); a compound semiconductor including silicon carbide (SiC), gallium arsenide (GaAs), gallium phosphide (GaP), indium phosphide (InP), indium arsenide (InAs), and/or indium antimonide (InSb); an alloy semiconductor including silicone germanium (SiGe), gallium arsenide phosphide (GaAsP), aluminum indium arsenide (AlInAs), aluminum gallium arsenide (AlGaAs), gallium indium arsenide (GaInAs), indium gallium phosphide (GaInP), and/or gallium indium arsenide phosphide (GaInAsP); or combinations thereof. Other substrates, such as multi-layered or gradient substrates, sapphire substrates, etc. may also be used.

In some suitable embodiments, as shown in FIG. 1 for example, the first buffer layer 30 (and optionally further including the SLS 40) is formed over the substrate 20. Suitably, the first buffer layer 30 acts as a buffer and/or transition layer for the subsequently formed overlying layers. In some embodiments, the first buffer layer 30 may comprise a III-V compound, for example, such as aluminum nitride (AlN) and/or aluminum gallium nitride (AlGaN). In other embodiments, the first buffer layer 30 may comprise other III-V compounds, such as aluminum arsenide (AlAs), or the like. In some embodiments, the first buffer layer 30 (and/or other subsequently deposited layers as appropriate) may be epitaxially grown using metal-organic chemical vapor deposition (MOCVD), molecular beam epitaxy (MBE), liquid phase epitaxy (LPE), vapor phase epitaxy (VPE), metal organic vapor phase epitaxy (MOVPE), selective epitaxial growth (SEG), a combination thereof, or the like. In some embodiments, the first buffer layer 30 may comprise a single layer or a plurality of layers. The illustrative embodiments herein focus on group III-nitride devices in which the buffer 30, 40 are typically GaN, AlGaN, AlN, or various multilayer structures thereof.

Suitably, the optional SLS layer 40 formed over the first buffer layer 30 (or, viewed alternatively, which is a part of the first buffer layer) may be used to provide additional lattice matching and/or to inhibit electrons, for example, from the substrate 20, from diffusing into, for example, the channel layer 60. In some suitable embodiments, the SLS layer 40 may include a plurality of layer pairs. For example, in the case of a GaN-based HEMT, each layer pair may include a layer of AlN and a layer of GaN.

In some suitable embodiments, as shown in FIG. 1, the second buffer layer 50 includes a first layer or thickness 52 of material doped with a first concentration of dopant and a second layer or thickness 54 of the material doped with a second concentration of the dopant. Suitably, the second concentration of dopant has a gradient along the second thickness 54, i.e., from a first side or surface 54a of the second thickness 54 which is proximate to the first thickness 52 to an opposing second side or surface 54b of the second thickness 54 which is proximate to the channel layer 60. In some suitable embodiments, the second thickness 54 of the second buffer layer 50 is between about 0.1 micrometers (μm) and about 1 μm, inclusive, and a thickness of the channel layer 60 is between about 0.2 μm and about 0.8 μm, inclusive.

In some suitable embodiments for GaN-based HEMT devices, the material of second buffer layer 50 may be GaN or the like (for example, another III-V compound material) and the dopant may be carbon (C) or the like (for example, iron (Fe)). In some embodiments, the buffer layer 50 may be epitaxially grown over the SLS layer 40 using similar methods as the buffer layer 30 described above. In some embodiments where second buffer layer 50 comprises GaN, the second buffer layer 50 may be epitaxially grown by using, for example, MOVPE, during which a gallium-containing precursor and a nitrogen-containing precursor are used. For example, the gallium-containing precursor may include trimethylgallium (TMG), triethylgallium (TEG), other suitable gallium-containing chemicals, a combination thereof, or the like. For example, the nitrogen-containing precursor may include ammonia ($NH_3$) or nitrogen ($N_2$), tertiarybutylamine (TBAm), phenyl hydrazine, other suitable nitrogen-containing chemicals, a combination thereof, or the like.

In some embodiments, the second buffer layer 50 may be doped using suitable dopants. In some embodiments for GaN-based HEMT devices, where the second buffer layer 50 comprises GaN, the second buffer layer 50 may be carbon doped, and hence the illustrative second buffer layer 50 is also denoted as a c-GaN buffer herein. In some embodiments, the second buffer layer 50 may be in situ doped while epitaxially growing the second buffer layer 50. In such embodiments, the epitaxial growing process may further include a carbon-containing precursor. For example, the carbon-containing gas precursor may include methane ($CH_4$), ethylene ($C_2H_4$), acetylene ($C_2H_2$), propane ($C_3H_8$), iso-butane (i-$C_4H_{10}$), trimethylamine [$N(CH_3)_3$], carbon tetrachloride ($CCl_4$) and metalloorganic precursor may be cyclohexene ($C_6H_{12}$) or a combination thereof, or the like. In some embodiments, the second buffer layer 50 is a semi-insulating layer that improves leakage and breakdown performances of the HEMT device 10.

Suitably, the first concentration of dopant in the first thickness 52 of the second buffer layer 50 is substantially uniform throughout. In practice, the first concentration of dopant in the first thickness 52 of the second buffer layer 50 may be between about $7 \times 10^{18}$ atoms of dopant per cubic centimeter ($cm^3$) of material and about $9 \times 10^{18}$ atoms of dopant per $cm^3$ of material.

In some suitable embodiments, the second concentration of dopant in the second thickness 54 of the second buffer layer 50 progressively or otherwise decreases from the first side or surface 54a of the second thickness 54 to the second side or surface 54b or the second thickness 54 and the gradient in the second concentration of dopant may be parabolic concave, parabolic convex or linear. In practice, the second concentration of dopant in the second thickness 54 of the second buffer layer 50 may decrease and/or otherwise vary from about $1 \times 10^{19}$ atoms of dopant per cubic centimeter ($cm^3$) of material at or near the first side or surface 54a of the second thickness 54 to about $1 \times 10^{16}$ atoms of dopant per $cm^3$ of material at or near the second side or surface 54b of the second thickness 54. In some alternative embodiments, the second concentration of dopant in the second thickness 54 of the second buffer layer 50 may decrease and/or otherwise vary from between about $7 \times 10^{18}$ and about $9 \times 10^{18}$ atoms of dopant per cubic centimeter ($cm^3$) of material at or near the first side or surface 54a of the second thickness 54 to between about $3 \times 10^{16}$ and about $6 \times 10^{16}$ atoms of dopant per $cm^3$ of material at or near the second side or surface 54b of the second thickness 54. The dopant gradient may be continuous, or may be stepwise due to stepwise adjustments of a mass flow controller delivering the hexene or other extrinsic carbon dopant, for example.

In some suitable embodiments, the second (i.e. dopant gradient) buffer layer 50 (and in particular the second thickness 54 of the second buffer layer 50) may be formed by a suitable deposition technique, for example, including, but not limited to, Metal Organic Chemical Vapor Deposition (MOCVD) or Molecular-Beam Epitaxy (MBE), Chemical Vapor Deposition (CVD), sputtering, and electron-beam (e-beam) deposition. MOCVD is also referred to in the art by similar nomenclatures such as metalorganic vapor phase epitaxy (MOVPE). In practice, the gradient in the second concentration of dopant in the second thickness 54 of the second buffer layer 50 may be produced by suitably regulating and/or controlling intrinsic doping factors and/or parameters and/or extrinsic doping factors and/or parameters. For example, intrinsic doping factors and/or parameters which may affect the dopant concentration in the second thickness 54 of the second buffer layer 50 include the temperature, pressure and/or growth rate at which the second thickness 54 of the second buffer layer 50 is formed. Extrinsic doping may be realized, for example, by introducing an extrinsic dopant source during the forming of the second thickness 54 of the second buffer layer 50. Accordingly, an extrinsic doping factor and/or parameter which may affect the dopant concentration in the second thickness 54 of the second buffer layer 50 includes, for example, a flow rate at which the extrinsic dopant source is introduced. In some suitable embodiments, the extrinsic dopant source may be a gas or other like precursor or reactant of methane ($CH_4$), acetylene ($C_2H_2$), cyclohexane ($C_6H_{12}$), carbon tetrabromide ($CBr_4$), combinations thereof and/or the like.

In some suitable embodiments, the gradient in the concentration of dopant in the second thickness 54 of the second buffer layer 50 is produced by a combination of intrinsic and extrinsic carbon doping, for example by varying, during the forming of the second thickness 54 of the second buffer layer 50, one or more of: (i) a temperature at which the second thickness 54 of the second buffer layer 50 is formed; (ii) a pressure at which the second thickness 54 of the second buffer layer 50 is formed; (iii) a growth rate at which the second thickness 54 of the second buffer layer 50 is formed; and (iv) a flow rate of a gas or precursor providing the extrinsic source of dopant to the second thickness 54 of the second buffer layer 50 while it is being formed. Suitably, to produce the desired gradient in the dopant concentration in the second thickness 54 of the second buffer layer 50, the temperature may be varied between about 800 degrees Celsius (C) and about 1000 degrees C., inclusive, during the forming of the second thickness 54 of the second buffer layer 50. In some embodiments, to produce the desired gradient in the dopant concentration in the second thickness 54 of the second buffer layer 50, the pressure may be varied between about 50 millibar (mbar) and about 400 mbar, inclusive, during the forming of the second thickness 54 of the second buffer layer 50.

In some suitable embodiments, producing the desired gradient in the dopant concentration in the second thickness 54 of the second buffer layer 50 is achieved at least in part by varying the flow rate of the extrinsic dopant source or precursor introduced during forming of the second thickness 54 of the second buffer layer 50, for example, such that a ratio of an amount of C (or other dopant) from the extrinsic source to an amount of Gallium (Ga) (or other buffer material) varies between about 5 and about 50, inclusive.

In some suitable embodiments, as shown in FIG. 1, the channel layer 60 is formed over the second buffer layer 50. In some embodiments, the channel layer 60 comprises a III-V compound, for example, such as gallium nitride (GaN), or the like. In some embodiments, the channel layer 60 may be epitaxially grown using the same or similar methods to those described above. In practice, the channel layer 60 may be undoped or unintentionally doped (i.e., with no dopant intentionally added, for example, that may cause the channel layer 60 to be n-type or p-type). Hence, the GaN channel layer 60 is also referred to herein as u-GaN 60.

In some suitable embodiments, the barrier layer 70 is formed over the channel layer 60. The barrier layer 70 may also be referred to and/or known as a polarization layer. In practice, the barrier layer 70 has a band gap higher than the band gap of the channel layer 60. In such embodiments, the barrier layer 70 generates a quantum well within the channel layer 60 at or near an interface 72 between the barrier layer 70 and the channel layer 60. The quantum well traps carriers, such as electrons or holes, and forms a channel (shown as a dashed line 62 in FIG. 5), which is known as a two-dimensional electron gas (2DEG) or a two-dimensional hole gas (2DHG), respectively, in the channel layer 60 near the interface 72. The dashed line 62 of the channel layer 60 diagrammatically indicates the 2DEG within the channel layer 60. In practice, the channel has high electron mobility at least in part because the channel layer 60 is effectively undoped and the carriers (such as, electrons or holes) can move freely without collision or with substantially reduced collisions with impurities (such as, for example, dopants). Furthermore, a 2DEG typically has a higher electron mobility than a three-dimensional electron gas due to the in-plane confinement of the 2DEG.

In some embodiments of GaN-based HEMT devices, the barrier layer 70 comprises AlGaN, or the like. In these illustrative GaN-based HEMT devices, the 2DEG is formed between the AlGaN barrier layer 70 and the underlying u-GaN channel layer 60. In such embodiments, the aluminum concentration of the $Al_xGa_{1-x}N$ layer 70 may be in a range of x=0.1 to x=0.9 depending on the detailed GaN-based HEMT design, although higher or lower Al concentrations are also contemplated. The aluminum content in the barrier compound layer 70 relative to the gallium content of the GaN layer 60 alters a polarization strength of the barrier layer 70. As with the GaN layers 50 and 60, the barrier layer 70 is suitably epitaxially grown over the channel layer 60 using MOCVD (i.e. MOVPE) or MBE. In some embodiments where the barrier layer 70 comprises AlGaN, the barrier layer 70 may be grown by a MOVPE process using an aluminum-containing precursor, a gallium-containing precursor, and a nitrogen-containing precursor. For example, the aluminum-containing precursor may include trimethylaluminum (TMA), triethylaluminium (TEA), other suitable aluminum-containing chemicals, a combination thereof, or the like. For example, the gallium-containing precursor and the nitrogen-containing precursor may be selected from the same candidate precursors mentioned above.

As shown in FIG. 1, the HEMT device 10 further includes: a source structure and/or terminal 80 formed over the barrier layer 70; a drain structure and/or terminal 82 formed over the barrier layer 70; and a gate structure and/or terminal 90 formed over the barrier layer 70 between the source structure and/or terminal 80 and the drain structure and/or terminal 82.

In some suitable embodiments, a gate layer may be formed over the barrier layer 70. In some embodiments, the gate layer may comprise GaN, or the like. In some embodiments, the gate layer may be formed using the same or similar methods to those described above. In some embodiments, gate layer comprises GaN, it may be epitaxially grown by using, for example, MOVPE or MBE, during which a gallium-containing precursor and a nitrogen-containing precursor are used. The gallium-containing precursor and the nitrogen-containing precursor may be selected from the same candidate precursors described above.

In some embodiments, the gate layer is p-doped. In some embodiments where the gate layer comprises GaN, the gate layer may be p-doped using magnesium (Mg), zinc (Zn), a combination thereof, or the like. In some embodiments, the gate layer may be in situ doped while epitaxially growing the gate layer. In such embodiments, the MOVPE process may further include a magnesium-containing precursor, a zinc-containing precursor, or a combination thereof. For example, the magnesium-containing precursor may include bis-cyclopentadienyl magnesium ($Cp_2Mg$), bismethylcyclopentadienyl magnesium [$(MeCp)_2Mg$], bisethylcyclopentadienyl magnesium ($ECp_2Mg$), a combination thereof, or the like. The zinc-containing precursor may include diethylzinc (DEZn), or the like. In other embodiments, the gate layer may be doped after the formation of the gate layer is completed. In such embodiments, the gate layer may be doped using an implantation method, or the like. In some embodiments, an annealing process may be performed to activate the dopants.

In some suitable embodiments, for example as shown in FIG. 1, the gate layer is patterned to remove portions of the gate layer over the barrier layer 70, thereby forming the gate structure and/or terminal 90. In some embodiments, the gate layer may be patterned using suitable photolithography and etching methods.

In some embodiments, the patterned gate layer (resulting in the gate structure and/or terminal 90) depletes carriers in a central region of the channel 62 (i.e., the centrally location region of the channel 62 directly below the gate structure and/or terminal 90). Portions of the channel 62 on either side of the central region of the channel 62 may form access regions, which may also be referred to as source/drain regions. Source/drain may refer to a source or a drain, individually or collectively dependent upon the context. In such embodiments, the channel 62 has a non-uniform carrier concentration, with the carriers having a higher concentration in the access regions than in the central region of the channel 62. In practice, a gate electrode may be formed over the patterned gate layer comprising the gate structure and/or terminal 90 that allows for tuning the carrier concentration in the central region of the channel 62. Accordingly, the patterned gate layer may be a part of a gate structure and/or terminal 90 formed over the central region of the channel layer 62. In some embodiments, by forming the gate layer over the barrier layer 70 such that carriers are depleted in the central region of the channel 62, a threshold voltage (Vth) of the HEMT device 10 may be increased.

In some suitable embodiments, the source structure and/or terminal 80 is formed on one side of the gate structure and/or terminal 90 and the drain structure and/or terminal 82 is formed on another side of the gate structure and/or terminal 90, such that the gate structure and/or terminal 90 resides between the source structure and/or terminal 80 and the drain structure and/or terminal 82. In practice, the source structure and/or terminal 80 may be formed above the source region of the channel 62 and the drain structure and/or terminal may be formed above the drain region of the channel 62.

Figure 2:
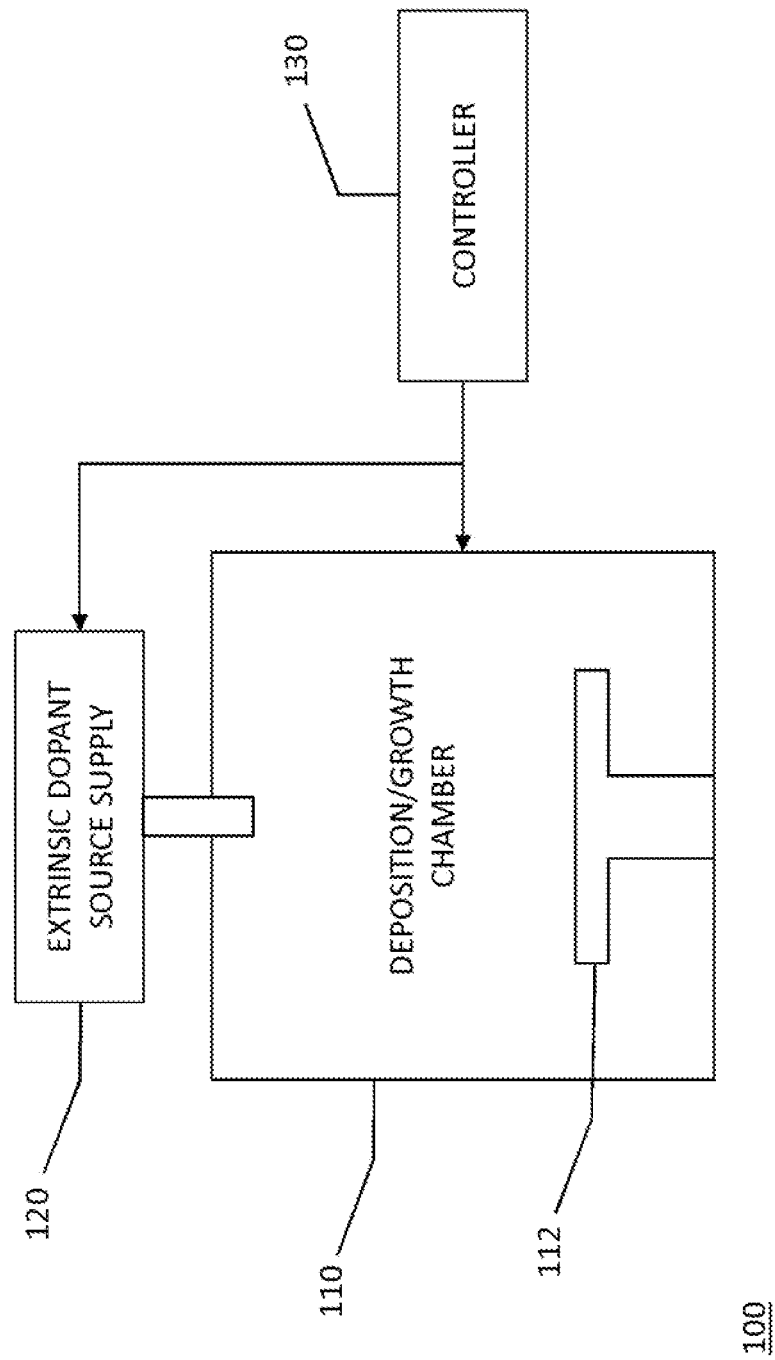
FIG. 2 diagrammatically illustrates a system for manufacturing a HEMT in accordance with some embodiments disclosed herein.

FIG. 2 shows an apparatus (for example, such as a semiconductor manufacturing tool) and/or system 100 suitable for manufacturing the HEMT device 10. In some suitable embodiments, a deposition and/or growth chamber 110 and a supply 120 of an extrinsic dopant source or dopant precursor are controlled by a controller 130. In some embodiments, the system 100 is an MOCVD reactor and the growth chamber 110 is a vacuum chamber. In other embodiments the system 100 is an MBE system and the growth chamber 110 is an ultrahigh vacuum (UHV) chamber. Not shown in FIG. 2 are numerous additional components such as gas feeds for TMGa or TEGa or another gallium source, TMA1 or TEA1 or another aluminum source, a gas nitrogen, ammonia, or other nitrogen source inlet, and so forth. While not shown for simplicity and/or clarity herein, the controller 130 may further regulate and/or control one or more supplies that selectively deliver, provide and/or introduce other precursors and/or reagents to the chamber 110 in order to form the various layers of the HEMT 10 under the direction and/or control of the controller 130. In practice, the controller 130 regulates a flow rate at which the extrinsic dopant source and/or dopant precursor is provided, delivered and/or introduced from the supply 120 to the chamber 110, for example, during forming of the second thickness 54 of the second buffer layer 50, such that the desired ratio of dopant to buffer material is achieved and/or varied as described above and/or otherwise as appropriate. In practice, producing the desired gradient in the dopant concentration in the second thickness 54 of the second buffer layer 50 is achieved at least in part by the controller 130 varying the flow rate at which the dopant precursor is introduced from the supply 120 to the chamber 110 during forming of the second thickness 54 of the second buffer layer 50, for example, such that a ratio of an amount of C (or other dopant) from the extrinsic source to an amount of Gallium (Ga) (or other buffer material) varies between about 5 and about 50, inclusive.

In some embodiments, the controller 130 may also establish and/or regulate an operating environment and/or conditions within the growth and/or deposition chamber 110, for example, such as, without limitation, the temperature, pressure and/or growth rate at which the second thickness 54 of the second buffer layer 50 is formed. In some suitable embodiments, to aid in producing the desired gradient in the dopant concentration in the second thickness 54 of the second buffer layer 50, in practice, the controller 130 may vary the operative temperature within the chamber 110 between about 800 degrees Celsius (C) and about 1000 degrees C., inclusive, during the forming of the second thickness 54 of the second buffer layer 50. In some suitable embodiments, to aid in producing the desired gradient in the dopant concentration in the second thickness 54 of the second buffer layer 50, in practice, the controller 130 may vary the operative pressure within the chamber 110 between about 50 millibar (mbar) and about 400 mbar, inclusive, during the forming of the second thickness 54 of the second buffer layer 50.

As shown in FIG. 2, the deposition and/or growth chamber 110 includes a pedestal 112 or the like upon which is held or secured the substrate 20 while the various layers of the HEMT device 10 are formed. For example, the pedestal 112 may include a vacuum, electrostatic or other suitable chuck for selectively securing the substrate 20 to the pedestal 112, and typically is motorized to rotate during the epitaxial growth to improve lateral uniformity of the epitaxial layers across the wafer. In practice, one or more of the various layers of the HEMT device 10 may be grown, deposited and/or otherwise formed in succession in the same tool and/or chamber 110, for example, while the substrate 20 is held atop the pedestal and rotating.

In some embodiments, the controller 130 may be implemented via hardware, software, firmware or a combination thereof. In particular, one or more controllers 130 may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying the controller 130 may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

Figure 3:
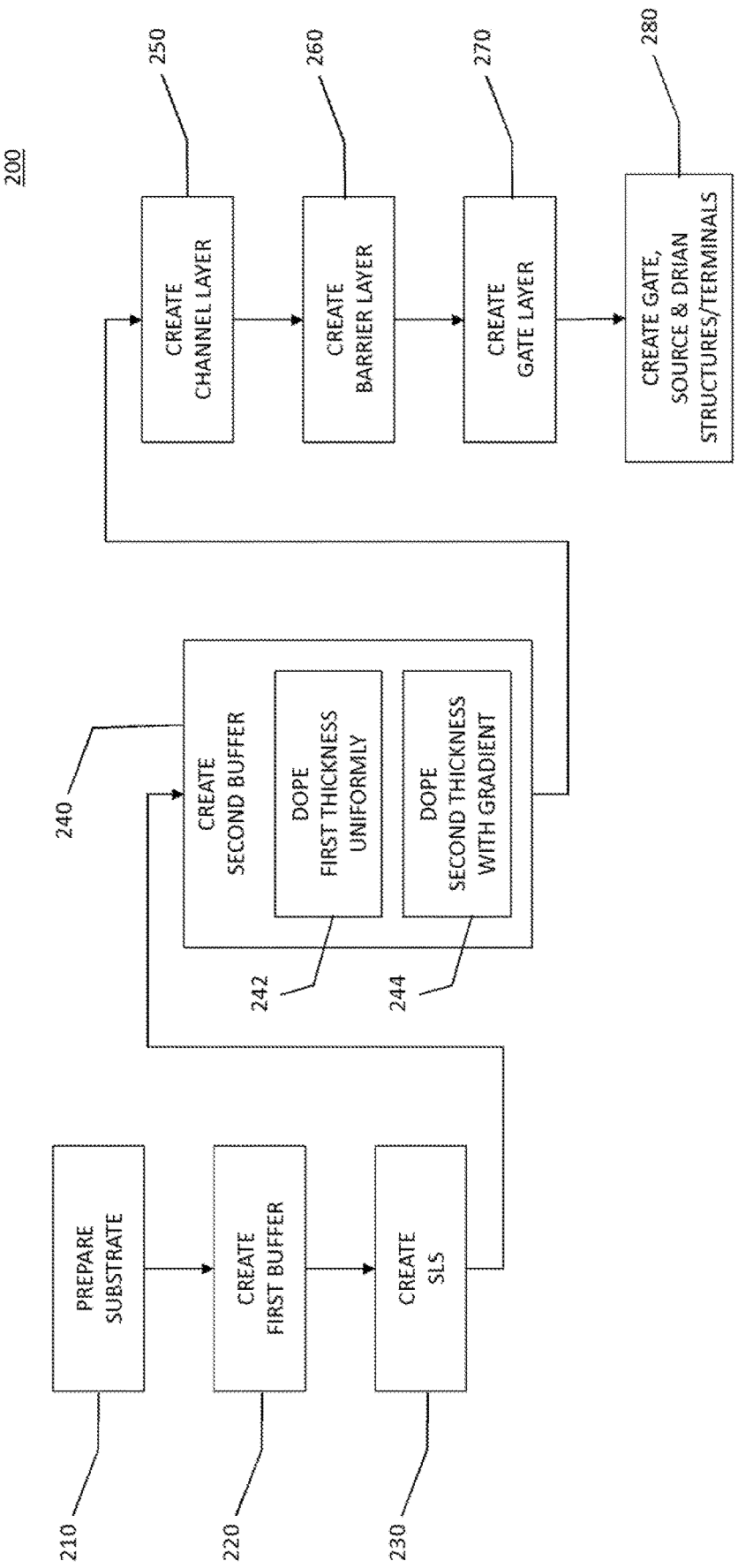
FIG. 3 is a flow chart showing a method and/or process of manufacturing a HEMT in accordance with some embodiments disclosed herein.

FIG. 3 is a flow chart showing an exemplary method and/or process 200 for manufacturing the HEMT device 10 in accordance with some suitable embodiments disclosed herein.

As shown in FIG. 3, the process 200 begins with step 210, including preparation of the substrate 20. For example, step 210 may include loading the substrate 30 into the chamber 110 and/or securing the substrate 20 to the pedestal 112. Additional substrate preparations, for example, such as suitable cleaning of the substrate 30 may also be performed.

In some suitable embodiments, as shown in FIG. 3 at step 220, the first buffer layer 30 is grown, deposited and/or otherwise formed over the substrate 20.

In some suitable embodiments, as shown in FIG. 3 at step 230, the SLS layer 40 is grown, deposited and/or otherwise formed over the first buffer layer 30. (Again, the steps 220 and 230 may alternatively be viewed as two steps of forming a multilayer buffer layer).

As shown in FIG. 3 at step 240, in some suitable embodiments, the second buffer layer 50 is grown, deposited and/or otherwise formed over the SLS layer 40. In practice, step 240 may include a first sub-step 242 of growing, depositing and/or otherwise forming the first layer or thickness 42 of the second buffer layer 50, and a second subsequent sub-step 244 of growing, depositing and/or otherwise forming the second layer or thickness 44 of the second buffer layer 50. In some suitable embodiments, the first layer or thickness 52 of the second buffer layer 50 is doped with a first concentration of dopant that is substantially uniform, while the second layer or thickness 54 of the second buffer layer 50 is doped with a second concentration of dopant that varies with a gradient along the thickness, i.e., the second concentration of dopant in the second thickness 54 of the second buffer layer 50 progressively or otherwise decreases from the first side or surface 54a of the second thickness 54 to the second side or surface 54b or the second thickness 54 and the gradient in the second concentration of dopant may be parabolic concave, parabolic convex or linear.

In some suitable embodiments, as shown in FIG. 3 at step 250, the channel layer 60 is grown, deposited and/or otherwise formed over the second buffer layer 50.

In some suitable embodiments, as shown in FIG. 3 at step 260, the barrier layer 70 is grown, deposited and/or otherwise formed over the channel layer 60.

As shown in FIG. 3 at step 270, in some suitable embodiments, a gate layer is grown, deposited and/or otherwise formed over the barrier layer 70.

As shown in FIG. 3 at step 280, in some suitable embodiments, the source structure and/or terminal 80 is formed over the barrier layer 70; the drain structure and/or terminal 82 is formed over the barrier layer 70; and the gate structure and/or terminal 90 is formed over the barrier layer 70 between the source structure and/or terminal 80 and the drain structure and/or terminal 82. In practice, forming the gate structure and/or terminal 90 may include suitable patterning of the gate layer formed in step 270.

Figure 4:
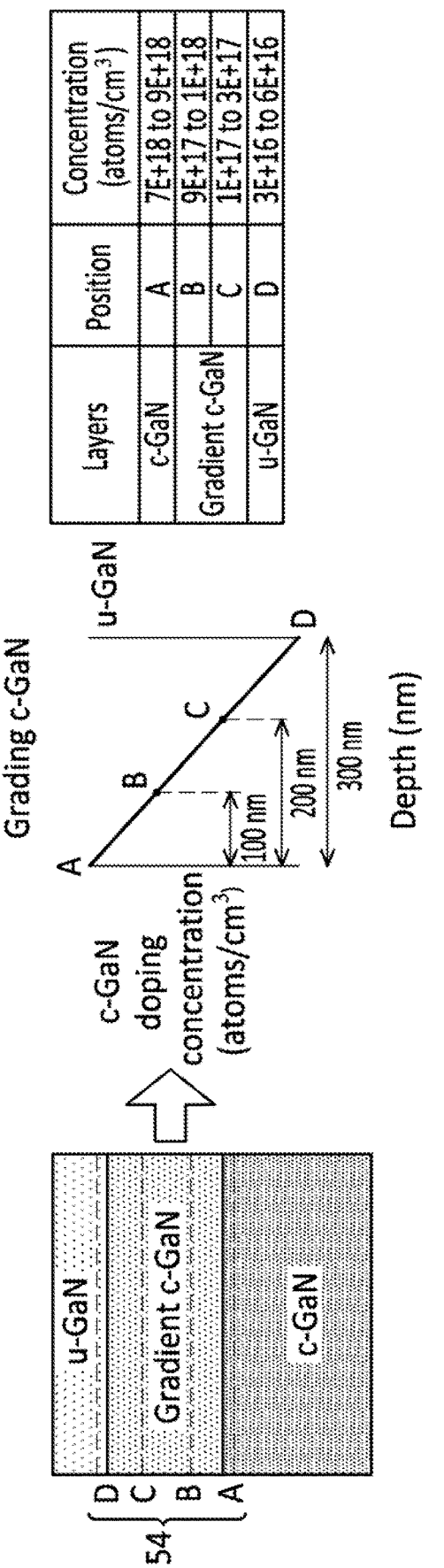
FIG. 4 diagrammatically presents a suitable carbon doping gradient of an illustrative GaN-based HEMT device as disclosed herein.

With reference to FIG. 4, an example of the graded carbon doping profile of the gradient-doped layer 54 for a GaN-based HEMT is shown. The lefthand diagram of FIG. 4 depicts a portion of the HEMT device structure of FIG. 1, including the uniformly doped c-GaN layer 52, the graded c-GaN layer 54 with graded carbon doping, and the not-intentionally-doped u-GaN channel layer 60. The letters "A", "B", "C", and "D" in the lefthand diagram represent depth planes through the structure taken at different depths along the growth direction.

The middle plot of FIG. 4 titled "Grading c-GaN" plots the c-GaN carbon doping on the y-axis against depth on the x-axis. This is a diagrammatic representation of the target carbon doping concentration, not experimental data. In the illustrative example of FIG. 4, the layer 54 has a thickness of about 300 nm. As shown, over this ~300 nm the doping decreases from a highest doping level at the depth "A" which is slightly within the underlying uniformly doped c-GaN layer 52, to a lowest doping at the depth "D" which is slightly within the upper u-GaN channel layer 60. Points "B" and "C" are intermediate points between the points "A" and "D" as shown. The illustrative target doping gradient shown in the middle plot of FIG. 4 is a linear gradient. However, as noted previously, some variation from the linear profile is contemplated. Moreover, depending on the doping level resolution achievable using the mass flow controller or other control of the hexene or other extrinsic carbon dopant source flow control, the carbon doping gradient might have a stepwise profile, e.g. with each step corresponding to a discrete digitized decrease in the hexene flow rate.

The righthand table of FIG. 4 presents some suitable ranges for the carbon doping level at each of the depths "A", "B", "C", and "D". The detailed choice of doping concentration at each depth can be tailored for a given GaN-based HEMT device and for achievable doping levels attainable for a given MOCVD or other growth system, along with HEMT design considerations. As can be seen, the doping gradient is targeted to decrease the carbon doping level by about two orders of magnitude over the ~300 nm thickness of the layer 54, i.e. from a carbon doping level of between $7 \times 10^{18}$ cm$^{-3}$ and $9 \times 10^{18}$ cm$^{-3}$ at depth "A" to between $3 \times 10^{16}$ cm$^{-3}$ and $6 \times 10^{16}$ cm$^{-3}$ at depth "D" in this nonlimiting illustrative example. Such a dopant gradient within these ranges advantageously reduces current collapse effects by compensating buffer trap electrons along with better 2DEG confinement for gate control. This grading of the carbon doping with extrinsic c-doped GaN effectively improves the GaN channel layer along with substantially reduced dislocation density, which also combats the current-collapse effect.

Figure 5:
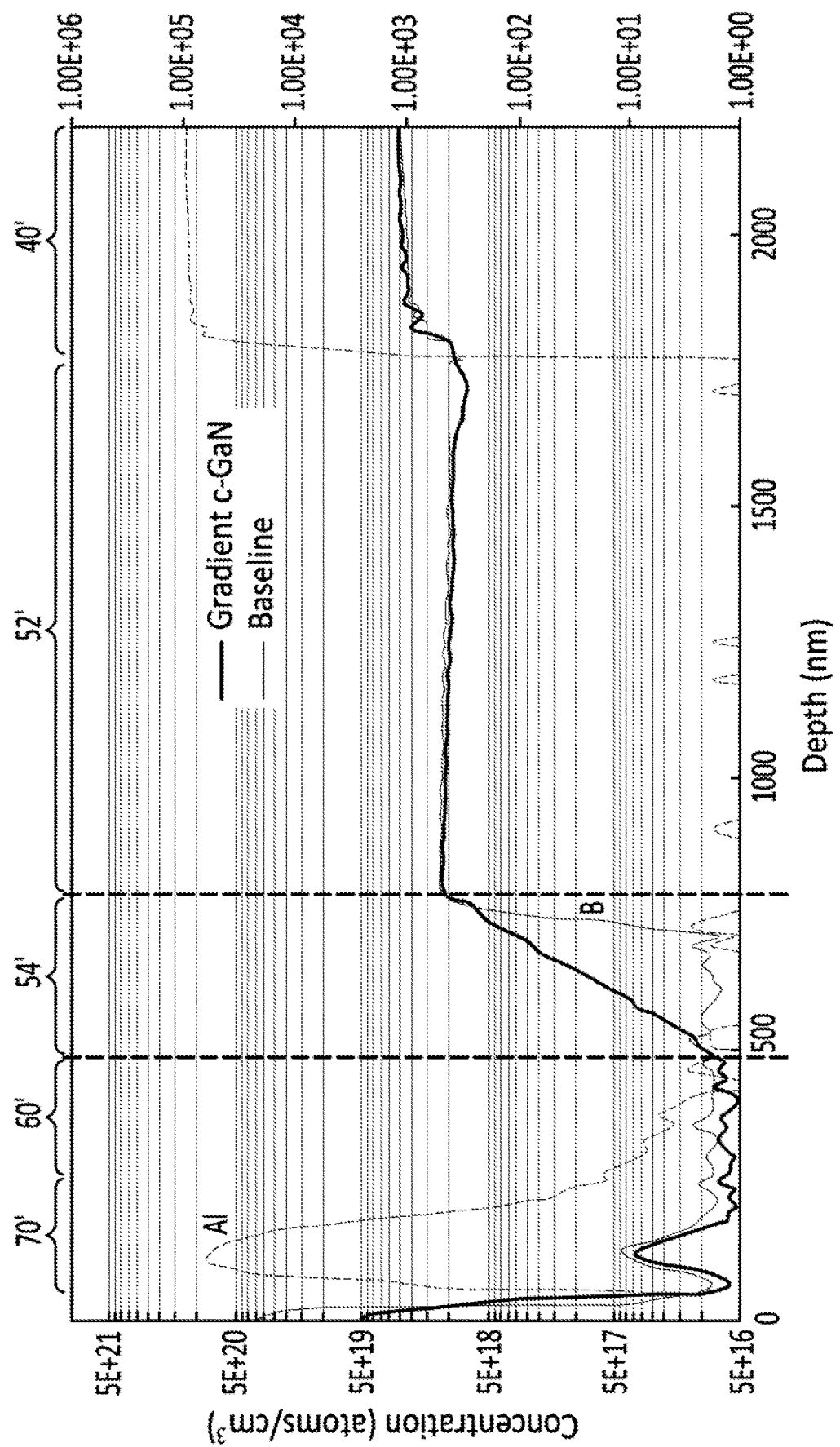
FIG. 5 presents secondary ion mass spectroscopy (SIMS) data acquired for two fabricated GaN-based HEMT devices as described herein.

With reference now to FIG. 5, two GaN-based HEMT device structures were grown by MOCVD and were characterized by secondary ion mass spectroscopy (SIMS). The first device whose SIMS plot is labeled "Gradient c-GaN" had a nominal structure corresponding to that of FIG. 1, in which the graded c-GaN layer 54 has a graded carbon concentration targeting a linear profile similar to that of FIG. 4 using a combination of intrinsic carbon doping and extrinsic carbon doping using hexene as the extrinsic dopant. The second device whose SIMS plot is labeled "Baseline" is similar, employed a constant intrinsic carbon doping level in the layer 54, with no extrinsic carbon doping used in the baseline design. The SIMS data is presented as a plot of concentration (in cm$^{-3}$) on the y-axis versus etch depth in nm on the x-axis. Above the plot, the estimated ranges of the SLS layer 40, c-GaN layer 52, c-GaN layer 54, u-GaN channel 60, and AlGaN layer 70 are indicated using corresponding primed reference numbers 40', 52', 54', 60', and 70' (where the use of the prime (') indicates these are estimates based on the SIMS profiles). In addition to the carbon plots, the aluminum concentration is also plotted for one HEMT device to provide further context for identifying the Al-containing layers 40 and 70. As seen in the SIMS data for the "Gradient c-GaN" sample, a highly linear gradient in the carbon doping is observed for the region 54' estimated to correspond to the graded c-GaN layer 54, with the carbon doping level decreasing from the mid $10^{18}$ cm$^{-3}$ range proximate to the uniformly doped c-GaN layer 52' to the mid $10^{16}$ cm$^{-3}$ range proximate to the u-GaN channel layer 60'. By contrast, the "Baseline" sample shows a sharp stepwise drop in carbon concentration near the interface between the c-GaN layers 52' and 54'. Hence, the SIMS data for the "Gradient c-GaN" sample confirms that the combination of intrinsic and extrinsic (hexene) carbon doping can achieve the desired linear carbon profile.

Figure 6:
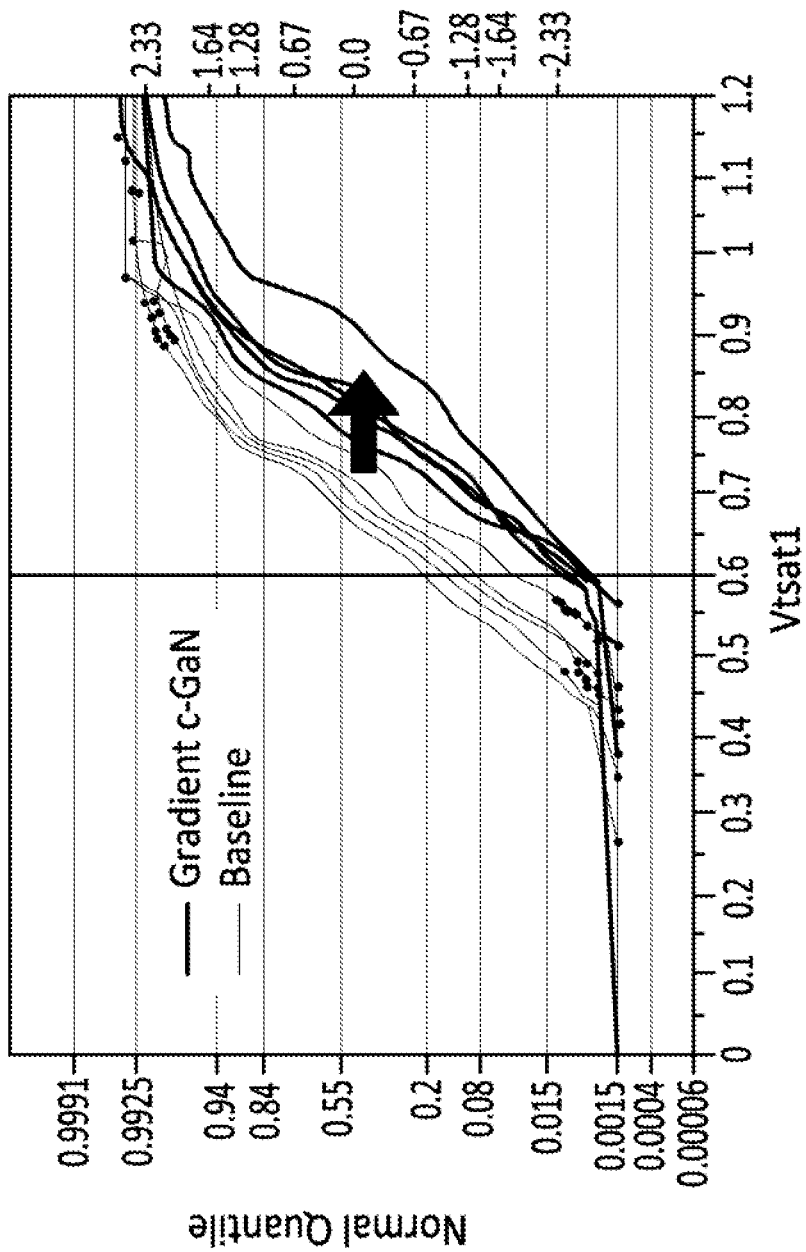
FIG. 6 presents Vsat measurements for GaN-based HEMT devices analogous to those whose SIMS profiles are shown in FIG. 5.

With reference to FIG. 6, Vsat measurements are presented for GaN-based HEMT devices analogous to those whose SIMS profiles are shown in FIG. 5. As can be seen, the value of Vsat is shifted significantly for the "Gradient c-GaN" HEMT device as compared with the "Baseline" GaN-based HEMT device. The Vsat results indicate source-to-bulk leakage improvement using the gradient carbon doping in the "Gradient c-GaN" device. Without being limited to any particular theory of operation, it is believed that Vsat is improved at least in part because the gradient carbon doping compensates electron trapping in the c-GaN and provides improved 2DEG confinement for gate control.

Figure 7:
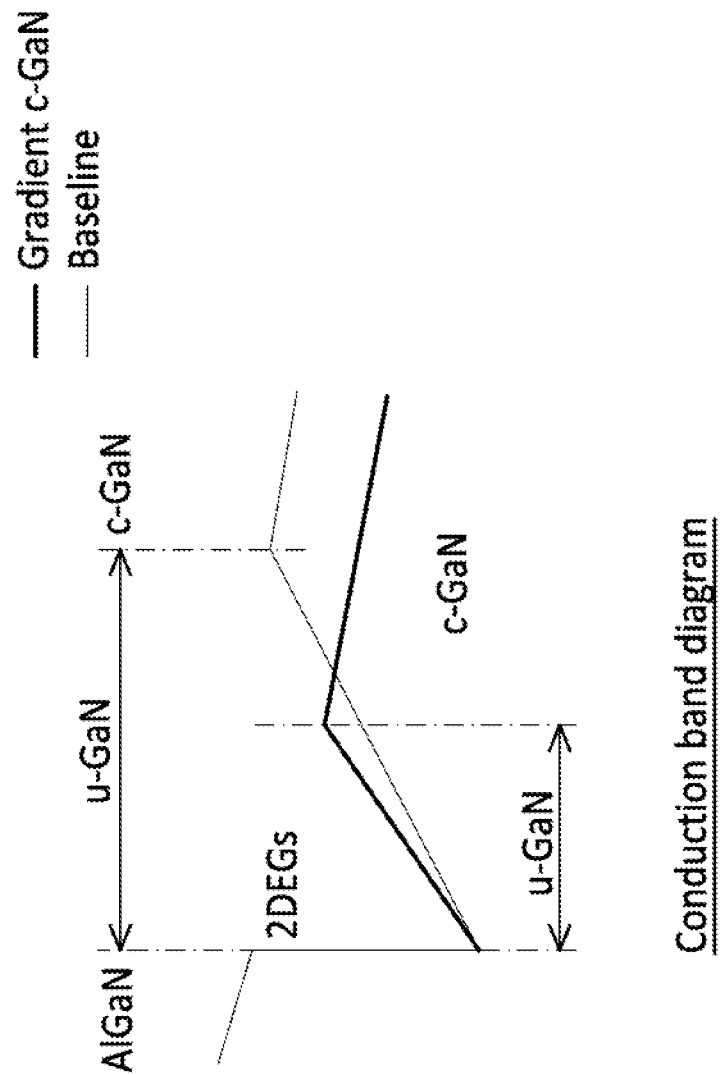
FIG. 7 diagrammatically represents the expected conduction band diagram for two GaN-based HEMT devices analogous to those characterized by the SIMS data presented in FIG. 5.

With reference to FIG. 7, theoretical conduction band diagrams are shown for the "Gradient c-GaN" HEMT device and the "Baseline" GaN-based HEMT device. The conduction band diagram illustrates how the linear carbon gradient is believed to introduce stronger electron confinement at the AlGaN/GaN heterointerface in the case of the "Gradient c-GaN" HEMT device.

In the following, some further illustrative embodiments are described.

In some embodiments, a method of manufacturing a High-Electron-Mobility Transistor (HEMT) includes: preparing a substrate; forming a first buffer over the substrate; forming a second buffer over the first buffer, wherein forming the second buffer includes doping a first thickness of gallium nitride (GaN) with a first concentration of dopant, and doping a second thickness of GaN with a second concentration of the dopant such that the second concentration of dopant has a gradient though the second thickness which progressively decreases in a direction away from the first thickness; forming a channel layer of GaN over the second buffer; forming an aluminum gallium nitride (AlGaN) layer over the channel layer; and forming drain, source and gate terminals for the HEMT.

In some further embodiments, the dopant is Carbon (C).

In still additional embodiments, doping the first thickness of GaN is conducted so that the first concentration of dopant is uniform in the first thickness; and doping the second thickness of GaN is conducted so that the gradient is one of parabolic concave, parabolic convex and linear.

In some embodiments, the gradient of the second concentration varies from $1\times10^{19}$ atoms of dopant per cubic centimeter ($cm^3$) of material at a first side of the second thickness to $1\times10^{16}$ atoms of dopant per $cm^3$ of material at a second side of the second thickness.

In yet further embodiments, the second thickness is between 0.1 and 1 micrometer (μm), inclusive, and a thickness of the channel layer is between 0.2 and 0.8 inclusive.

In some further embodiments, the substrate is one of a Silicon (Si)-based and Silicon Carbide (SiC)-based substrate; the first buffer includes an Aluminum Nitride (AlN)/Aluminum Gallium Nitride (AlGaN)-based buffer and a strained layer superlattice (SLS); wherein the SLS is one of an AlN/GaN-based and AlN/AlGaN-based SLS.

In some embodiments, the method further includes regulating the second concentration of dopant in the second thickness by varying at least one of a temperature, a pressure and a growth rate at which forming the second buffer is performed.

In yet further embodiments, the temperature is varied between 800 degrees Celsius (C) and 1000 degrees C., inclusive.

In some embodiments, the pressure is varied between 50 millibar (mbar) and 400 mbar, inclusive.

In some further embodiments, the method further includes regulating the second concentration of dopant in the second thickness by introducing an extrinsic source of dopant to the second buffer while forming the second buffer.

In still further embodiments, the dopant is Carbon (C), and the extrinsic source is one of methane ($CH_4$), acetylene ($C_2H_2$), cyclohexane ($C_6H_{12}$) and carbon tetrabromide ($CBr_4$).

In yet additional embodiments, the extrinsic source is a gas that is introduced at a flow rate which is varied during forming of the second buffer such that a ratio of an amount of C from the extrinsic source to an amount of Gallium (Ga) in the GaN varies between 5 and 50, inclusive.

In some further embodiments, a method for manufacturing a High-Electron-Mobility Transistor (HEMT) includes: forming a buffer between a substrate and a channel layer of the HEMT, and forming the buffer includes doping a thickness of Gallium Nitride (GaN) with a concentration of Carbon (C) such that the concentration of C has a gradient though the thickness of GaN that decreases in a direction away from the substrate. Suitably, the gradient is produced by varying, during said forming, at least one of: (i) a temperature at which the buffer is formed; (ii) a pressure at which the buffer is formed; (iii) a growth rate at which the buffer is formed; and (iv) a flow rate of a gas providing an extrinsic source of C to the buffer while the buffer is being formed.

In some additional embodiments, the buffer is formed by one of: Metal Organic Chemical Vapor Deposition (MOCVD), Molecular-Beam Epitaxy (MBE), Chemical Vapor Deposition (CVD), sputtering, and electron-beam (e-beam) deposition.

In some embodiments, a High-Electron-Mobility Transistor (HEMT) includes: a substrate; a first buffer layer formed over the substrate; a Strained-Layer Superlattice (SLS) layer formed over the first buffer layer; a second buffer layer formed over the SLS layer, wherein the second buffer layer includes a first thickness of material doped with a first concentration of dopant and a second thickness of the material doped with a second concentration of the dopant, the second concentration of dopant having a gradient along the second thickness; a channel layer formed over the second buffer layer; a barrier layer formed over the channel layer; and drain, source and gate terminals.

In some further embodiments, the material is Gallium Nitride (GaN) and the dopant is Carbon (C).

In some embodiments, the first concentration is uniform along the first thickness; and the gradient is one of parabolic concave, parabolic convex and linear.

In still further embodiments, the gradient of the second concentration varies from $1\times10^{19}$ atoms of dopant per cubic centimeter ($cm^3$) of material at a first side of the second thickness to $1\times10^{16}$ atoms of dopant per $cm^3$ of material at a second side of the second thickness, the second side being opposite the first side and proximate to the channel layer.

In yet further embodiments, the second thickness is between 0.1 and 1 micrometer (μm), inclusive, and a thickness of the channel layer is between 0.2 and 0.8 inclusive.

In still one more embodiment, the substrate is one of a Silicon (Si)-based and Silicon Carbide (SiC)-based substrate; the first buffer layer is an Aluminum Nitride (AlN)/Aluminum Gallium Nitride (AlGaN)-based buffer layer; the channel layer is a Gallium Nitride (GaN)-based channel layer; the SLS is one of an AlN/GaN-based and AlN/AlGaN-based SLS layer; and the barrier layer is an AlGaN-based barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a High-Electron-Mobility Transistor (HEMT), said method comprising:
    forming a first buffer over a substrate;
    forming a strained layer superlattice (SLS) layer in direct contact with the first buffer;
    forming a second buffer over and in direct contact with the SLS layer, wherein forming the second buffer includes:
        doping a first thickness of gallium nitride (GaN) with a first concentration of dopant; and doping a second thickness of GaN with a second concentration of the dopant such that the second concentration of dopant has a gradient though the second thickness which progressively decreases in a direction away from the first thickness;

forming a channel layer of GaN over and in direct contact with the second buffer;

forming an aluminum gallium nitride (AlGaN) layer over the channel layer; and forming drain, source and gate terminals for the HEMT.

2. The method of claim 1, wherein the dopant is Carbon (C).

3. The method of claim 1, wherein:

doping the first thickness of GaN is conducted so that the first concentration of dopant is uniform in the first thickness; and doping the second thickness of GaN is conducted so that the gradient is one of parabolic concave, parabolic convex and linear.

4. The method of claim 1, wherein the gradient of the second concentration varies from between $7\times10^{18}$ atoms per $cm^3$ and $9\times10^{18}$ atoms per $cm^3$ at a first side of the second thickness to between $3\times10^{16}$ atoms per $cm^3$ and $6\times10^{16}$ atoms per $cm^3$ at a second side of the second thickness.

5. The method of claim 1, wherein the second thickness is between 0.1 and 1 micrometer (μm), inclusive, and a thickness of the channel layer is between 0.2 and 0.8 μm, inclusive.

6. The method of claim 1, wherein:

the substrate is one of a Silicon (Si)-based and Silicon Carbide (SiC)-based substrate; and the first buffer is an Aluminum Nitride (AlN)/Aluminum Gallium Nitride (AlGaN)-based buffer layer; and wherein the SLS layer is one of an AlN/GaN-based and AlN/AlGaN-based SLS.

7. The method of claim 1, further comprising:

regulating the second concentration of dopant in the second thickness by varying at least one of a temperature, a pressure and a growth rate at which forming the second buffer is performed.

8. The method of claim 7, wherein the temperature is varied between 800 degrees Celsius (C) and 1000 degrees C., inclusive.

9. The method of claim 7, wherein the pressure is varied between 50 millibar (mbar) and 400 mbar, inclusive.

10. The method of claim 1, further comprising:

regulating the second concentration of dopant in the second thickness by introducing an extrinsic source of dopant to the second buffer while forming the second buffer.

11. The method of claim 10, wherein the dopant is Carbon (C), and the extrinsic source is one of methane ($CH_4$), acetylene ($C_2H_2$), cyclohexane ($C_6H_{12}$) and carbon tetrabromide ($CBr_4$).

12. The method of claim 10, wherein the extrinsic source is a gas that is introduced at a flow rate which is varied during forming of the second buffer such that a ratio of an amount of C from the extrinsic source to an amount of Gallium (Ga) in the Ga varies between 5 and 50, inclusive.

13. A method for manufacturing a High-Electron-Mobility Transistor (HEMT), said method comprising:

forming a buffer in direct contact with and between both a strained layer superlattice (SLS) layer and a channel layer of the HEMT, wherein forming the buffer including doping a thickness of Gallium Nitride (GaN) with a concentration of Carbon (C) such that the concentration of C has a gradient though the thickness of GaN that decreases in a direction away from the substrate;

wherein the gradient is produced by varying, during said forming, at least one of: (i) a temperature at which the buffer is formed; (ii) a pressure at which the buffer is formed; (iii) a growth rate at which the buffer is formed; and (iv) a flow rate of a gas providing an extrinsic source of C to the buffer while the buffer is being formed.

14. The method of claim 13, wherein the buffer is formed by one of: Metal Organic Chemical Vapor Deposition (MOCVD), Molecular-Beam Epitaxy (MBE), Chemical Vapor Deposition (CVD), sputtering, and electron-beam (e-beam) deposition.

15. A method of manufacturing a High-Electron-Mobility Transistor (HEMT), the method comprising:

forming a first buffer layer over a substrate;

forming a Strained-Layer Superlattice (SLS) in direct contact with and over the first buffer layer;

forming a second buffer layer in direct contact with and over the SLS layer, wherein the second buffer layer includes a first thickness of material doped with a first concentration of dopant and a second thickness of the material doped with a second concentration of the dopant, said second concentration of dopant having a gradient along the second thickness;

forming a channel layer in direct contact with and over the second buffer layer;

forming a barrier layer over the channel layer; and forming drain, source and gate terminals.

16. The method of claim 15, wherein the material is Gallium Nitride (GaN) and the dopant is Carbon (C).

17. The method of claim 15, wherein:

the first concentration is uniform along the first thickness; and the gradient is one of parabolic concave, parabolic convex and linear.

18. The method of claim 15, wherein the gradient of the second concentration varies from $1\times10^{19}$ atoms of dopant per cubic centimeter ($cm^3$) of material at a first side of the second thickness to $1\times10^{16}$ atoms of dopant per $cm^3$ of material at a second side of the second thickness, said second side being opposite the first side and proximate to the channel layer.

19. The method of claim 15, wherein the second thickness is between 0.1 and 1 micrometer (μm), inclusive, and a thickness of the channel layer is between 0.2 and 0.8 μm, inclusive.

20. The method of claim 15, wherein:

the substrate is one of a Silicon (Si)-based and Silicon Carbide (SiC)-based substrate;

the first buffer layer is an Aluminum Nitride (AlN)/Aluminum Gallium Nitride (AlGaN)-based buffer layer;

the channel layer is a Gallium Nitride (GaN)-based channel layer;

the SLS is one of an AlN/GaN-based and AlN/AlGaN-based SLS layer; and the barrier layer is an AlGaN-based barrier layer.

* * * * *